United States Patent
Schenk

(10) Patent No.: US 9,336,954 B2
(45) Date of Patent: May 10, 2016

(54) QUASI-BROADBAND DOHERTY AMPLIFIER WITH ASSOCIATED CAPACITOR CIRCUIT

(75) Inventor: Lothar Schenk, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 65 days.

(21) Appl. No.: 14/115,061

(22) PCT Filed: Apr. 17, 2012

(86) PCT No.: PCT/EP2012/056989
§ 371 (c)(1),
(2), (4) Date: Oct. 31, 2013

(87) PCT Pub. No.: WO2012/150126
PCT Pub. Date: Nov. 8, 2012

(65) Prior Publication Data
US 2014/0062589 A1 Mar. 6, 2014

(30) Foreign Application Priority Data
May 5, 2011 (DE) .......................... 10 2011 075 312

(51) Int. Cl.
| | |
|---|---|
| *H03F 1/02* | (2006.01) |
| *H03F 3/68* | (2006.01) |
| *H01G 5/16* | (2006.01) |
| *H03F 1/42* | (2006.01) |

(52) U.S. Cl.
CPC .. *H01G 5/16* (2013.01); *H03F 1/02* (2013.01); *H03F 1/0288* (2013.01); *H03F 1/42* (2013.01); *H03F 3/68* (2013.01); *H03F 2200/198* (2013.01); *H03F 2200/36* (2013.01); *H03F 2200/378* (2013.01); *H03F 2200/391* (2013.01); *H03F 2200/417* (2013.01)

(58) Field of Classification Search
USPC .......................... 330/124 R, 295, 84, 286, 53
See application file for complete search history.

(56) References Cited

U.S. PATENT DOCUMENTS

| | | | |
|---|---|---|---|
| 7,064,606 B2 * | 6/2006 | Louis ........................ | 330/124 R |
| 7,773,959 B1 | 8/2010 | Bachhuber | |
| 2007/0008032 A1 | 1/2007 | Kyu | |

(Continued)

FOREIGN PATENT DOCUMENTS

| | | |
|---|---|---|
| EP | 0 637 042 A2 | 2/1995 |
| EP | 1 609 239 B1 | 12/2005 |

(Continued)

OTHER PUBLICATIONS

International Preliminary Report on Patentability mailed Nov. 5, 2013, issued in corresponding International Application No. PCT/EP2012/056989, filed Jul. 17, 2012, 10 pages.

(Continued)

*Primary Examiner* — Hieu Nguyen
(74) *Attorney, Agent, or Firm* — Christensen O'Connor Johnson Kindness PLLC

(57) ABSTRACT

An amplifier provides a first amplifier circuit (16), a second amplifier circuit (17), a first hybrid-coupler circuit (18) and a termination (3). The hybrid-coupler circuit (18) provides an output terminal (13) and an insulation terminal (12). In this context, the termination (3) is connected to the insulation terminal (12) of the hybrid-coupler circuit (18). The termination (3) comprises a first capacitor (34) and/or an inductance (35), which is disposed directly at the insulation terminal (12) of the hybrid-coupler circuit (18).

12 Claims, 12 Drawing Sheets

(56) References Cited

U.S. PATENT DOCUMENTS

Figure 1:
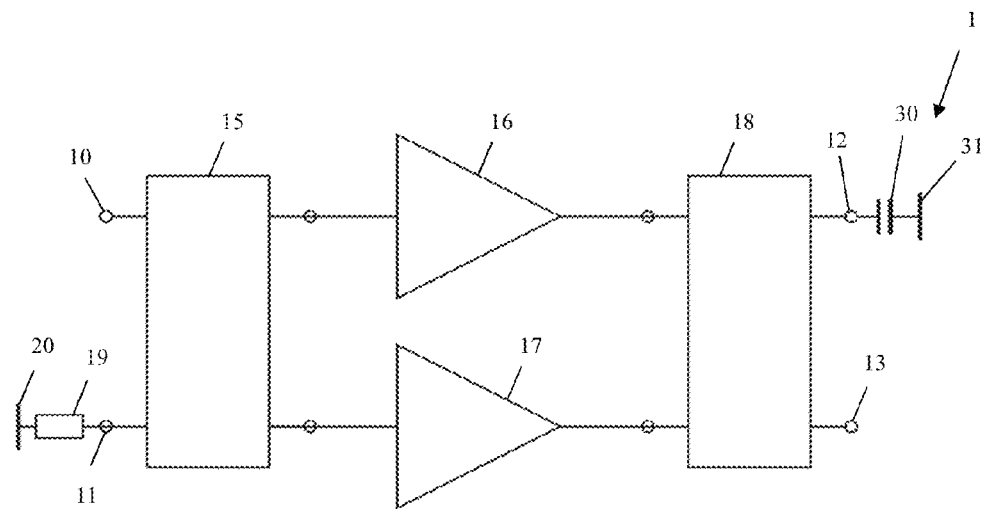

| 2007/0070576 | A1 | 3/2007 | Lynch |
| 2009/0102553 | A1 | 4/2009 | Yang |
| 2009/0146765 | A1 | 6/2009 | Chen |
| 2011/0169590 | A1 | 7/2011 | Namerikawa |

FOREIGN PATENT DOCUMENTS

| GB | 1 520 949 | 8/1978 |
| WO | 2011048893 A1 | 4/2011 |

OTHER PUBLICATIONS

Djoumessi, E.E., et al., "Varactor-Tuned Dual-Band Quadrature Hybrid Coupler," IEEE Microwave and Wireless Components Letters 16(11):603-605, Nov. 2006.

Fardin, E.A., et al., "A Varactor Tuned Branch-Line Hybrid Coupler," Proceedings of the Asia-Pacific Microwave Conference (APMC 2005), Dec. 4-7, 2005, Suzhou, China, 4 pages.

Ferrero, F., et al., "Compact Quasi-Lumped Hybrid Coupler Tunable Over Large Frequency Band," Electronics Letters 43(19):1030-1031, Sep. 2007.

Nishino, T., et al., "Tunable MEMS Hybrid Coupler and L-Band Tunable Filter," IEEE MTT-S International Microwave Symposium Digest (MTT 2009), Jun. 7-12, 2009, Boston, pp. 1045-1048.

International Search Report mailed Aug. 9, 2012, issued in corresponding International Application No. PCT/EP2012/056989, filed Jul. 17, 2012, 5 pages.

\* cited by examiner

QUASI-BROADBAND DOHERTY AMPLIFIER WITH ASSOCIATED CAPACITOR CIRCUIT

The invention relates to an amplifier, especially a Doherty amplifier and an associated capacitor circuit.

Doherty amplifiers are used conventionally to set up high-frequency amplifiers with high efficiency and high linearity.

A Doherty amplifier which uses a 3 dB coupler simultaneously as an impedance transformer for the main amplifier and as a power combiner for the main and auxiliary amplifier by terminating the de-coupled terminal of the 3 dB coupler, which is normally terminated with the system wave impedance, with a short-circuit or open-circuit line of a given length, is known from European Patent EP 1 609 239 B1. The arrangement shown in that context has the disadvantage that a frequency variation beyond the conventional Doherty bandwidth is not possible, and the space requirement for a low-loss line is relatively large.

The invention is based upon the object of providing a high-frequency amplifier and an associated capacitor circuit with a reduced space requirement which provides high efficiency and high linearity.

The object is achieved according to the invention for the device by the features of the independent claim 1 and for the capacitor circuit by the features of the independent claim 14. Advantageous further developments form the subject matter of the dependent claims relating back to these claims.

An amplifier according to the invention provides a first amplifier circuit, a second amplifier circuit, a first hybrid-coupler circuit and a termination. The hybrid-coupler circuit provides an output terminal and an insulation terminal. In this context, the termination is connected to the insulation terminal of the hybrid-coupler circuit. The termination comprises a first capacitor and/or an inductance, which is arranged directly at the insulation terminal of the hybrid-coupler circuit. In this manner, a high efficiency and great flexibility of use is achieved.

The invention is based upon the insight that the electrical properties of a short-circuited or open line of a given length can be modelled by discrete elements. Instead of the relatively space-intensive line structure, a capacitor or an inductance can be used. Instead of generating the wave impedance required for the termination by means of a short circuit or open circuit, which is transformed by means of a line to the insulation terminal, the necessary wave impedance is generated according to the invention directly at the insulation terminal by means of a discrete capacitor and/or a discrete inductance. The space requirement for the circuit can be dramatically reduced in this manner.

By preference, the capacitor or the inductance is adjustable. The frequency range of the amplifier can accordingly be adjusted in a simple manner.

A quasi-broadband system can be achieved if the adjustment is implemented automatically, that is, for example, by means of a servo motor. In systems in which changes in frequency are only rarely necessary and the amplifier operates simultaneously only in one frequency range, the amplifier can therefore be used within a very broad frequency range.

By preference, it is additionally possible to switch between the capacitor or the inductance and a termination by means of a 50 ohm resistance. In this manner, it is possible to switch between a broadband amplifier of conventional design with relatively poor efficiency and a tunable Doherty amplifier with relatively good efficiency.

Figure 2:
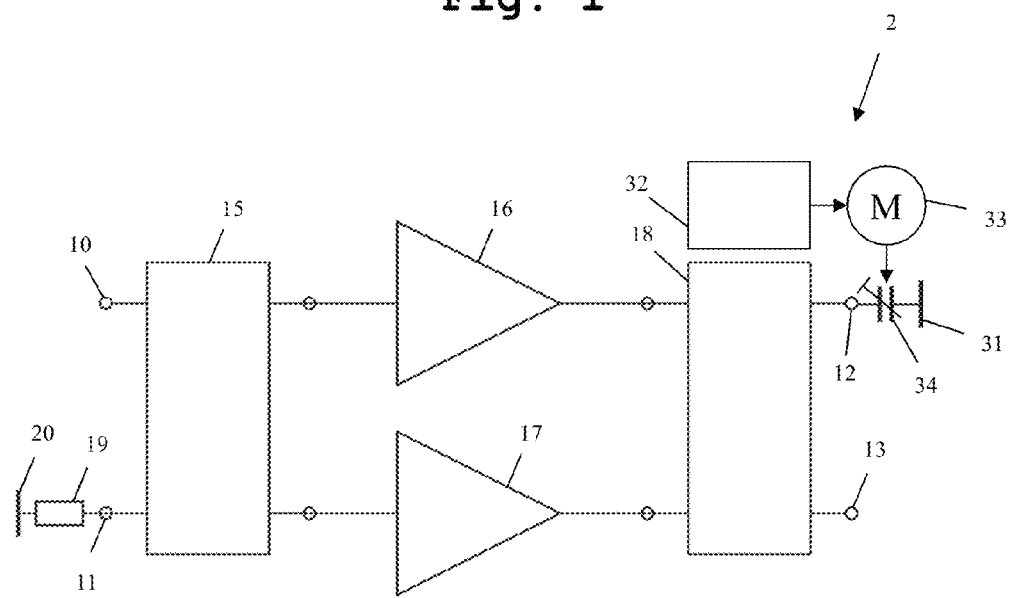
Figure 3:
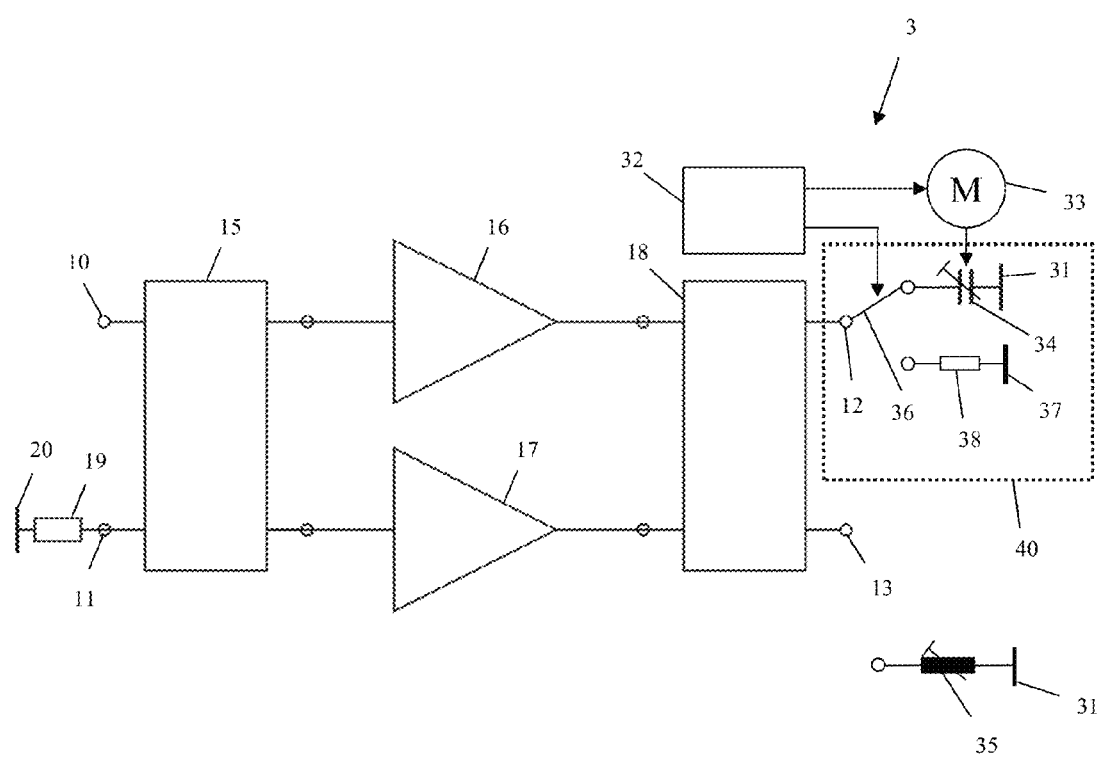
Figure 4:
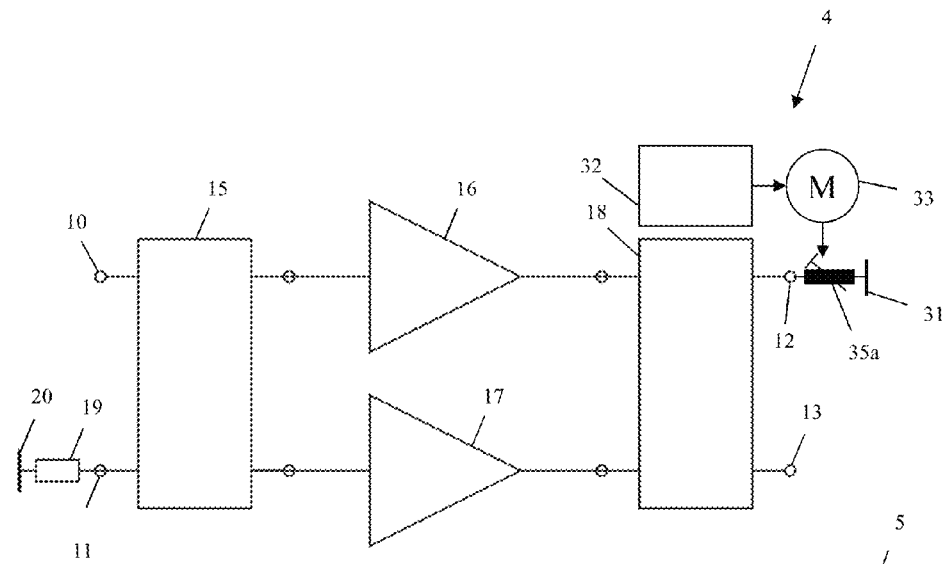
Figure 5:
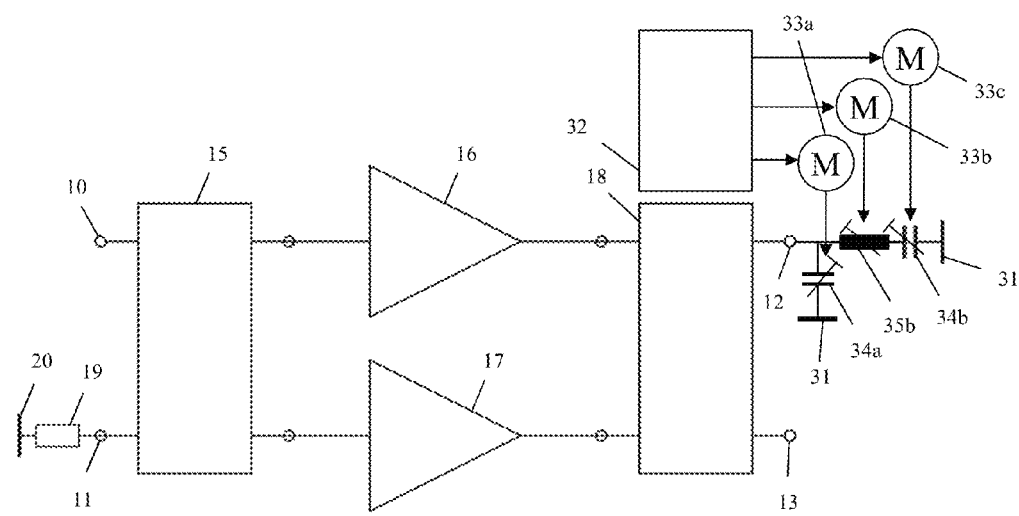
Figure 6A:
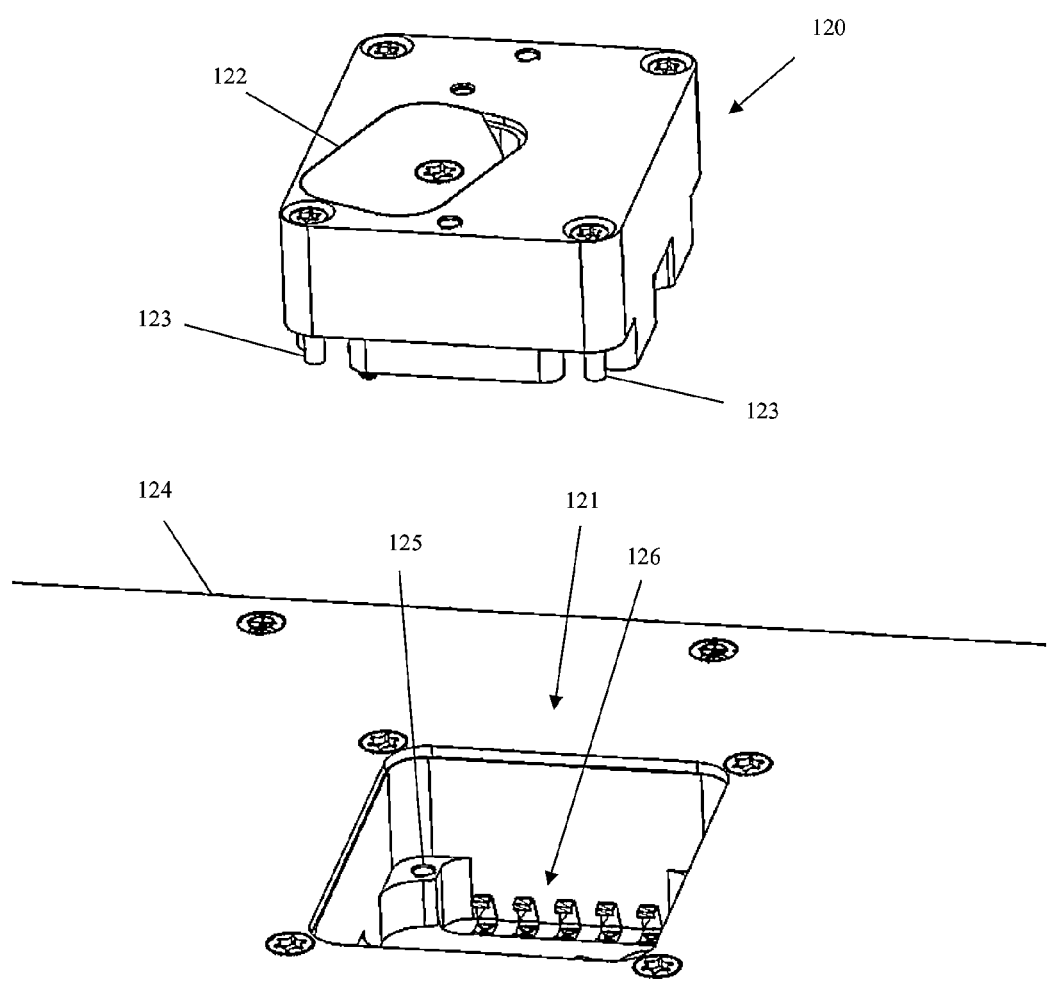
Figure 6B:
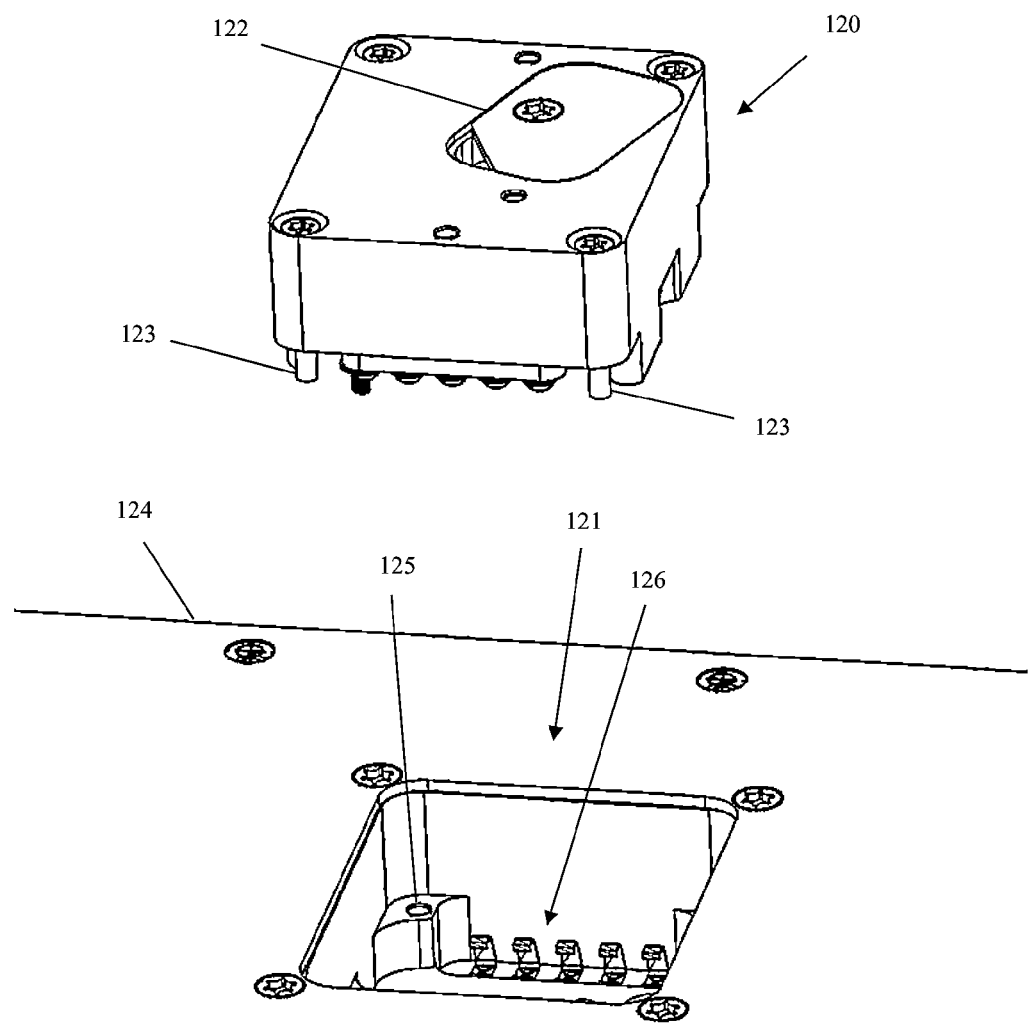
Figure 7:
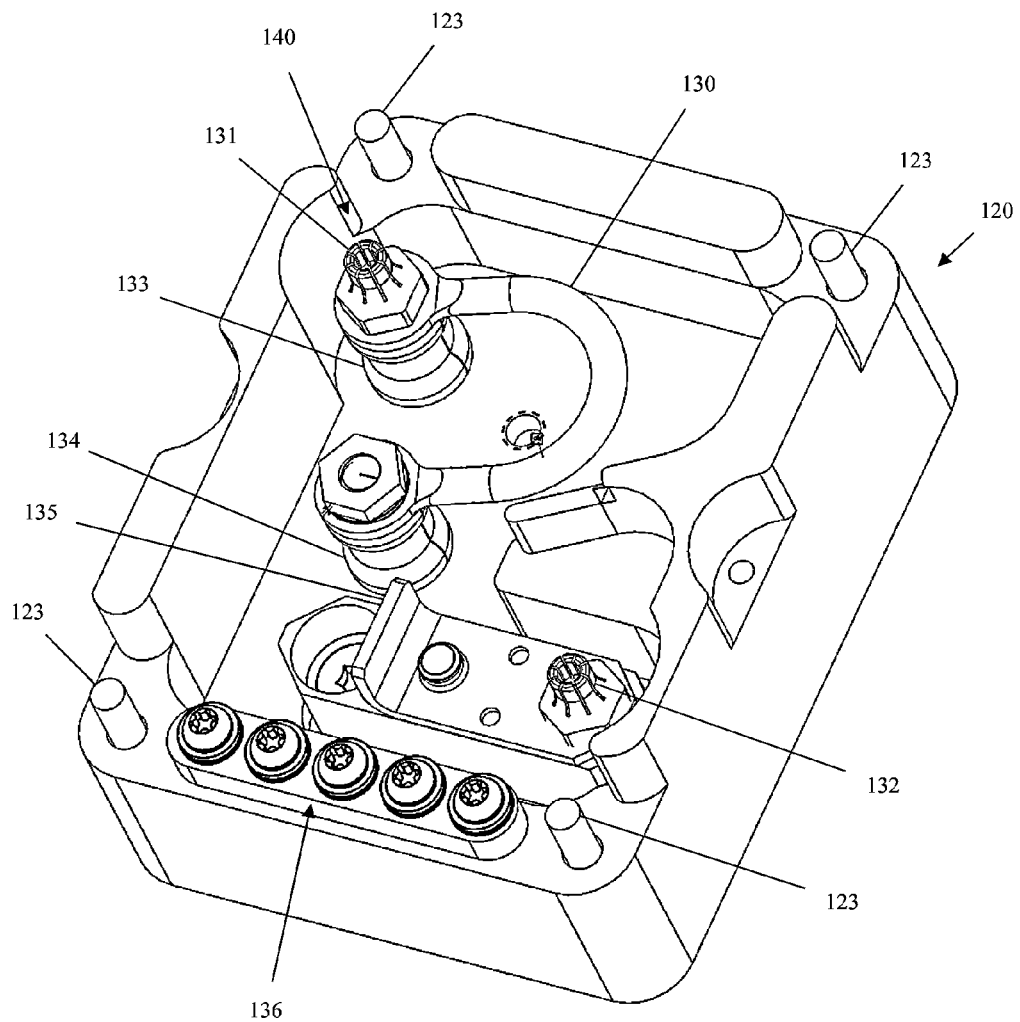
Figure 8:
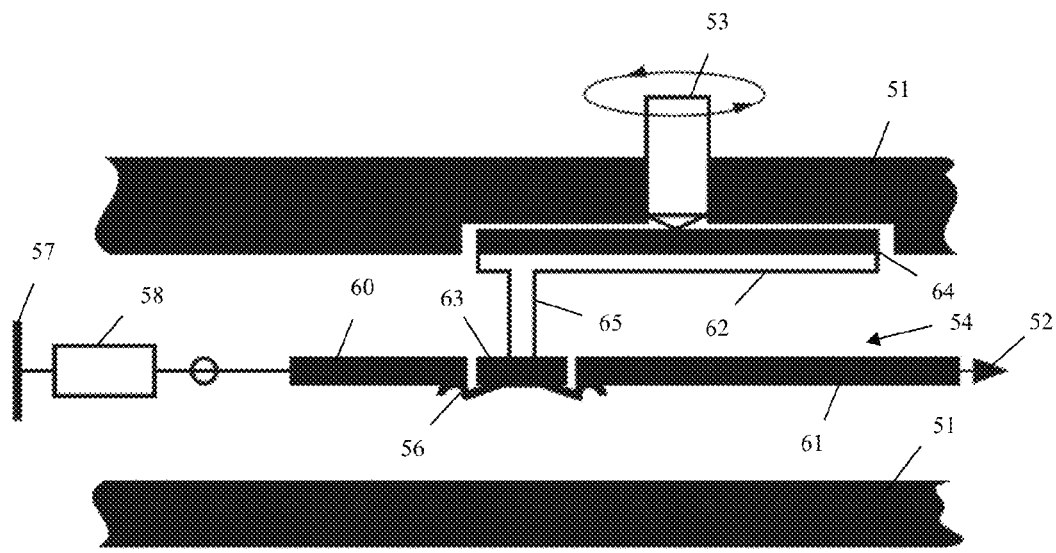
Figure 9:
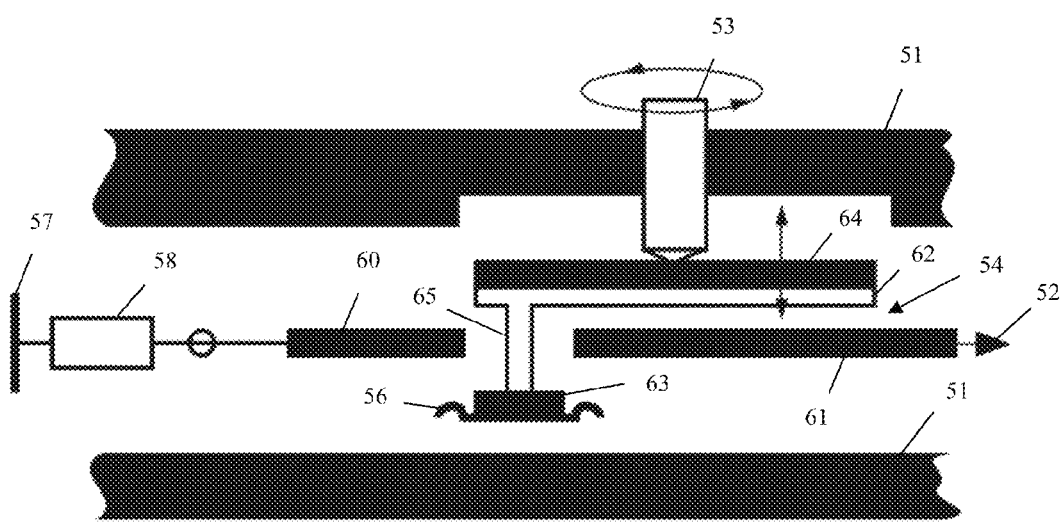
Figure 10:
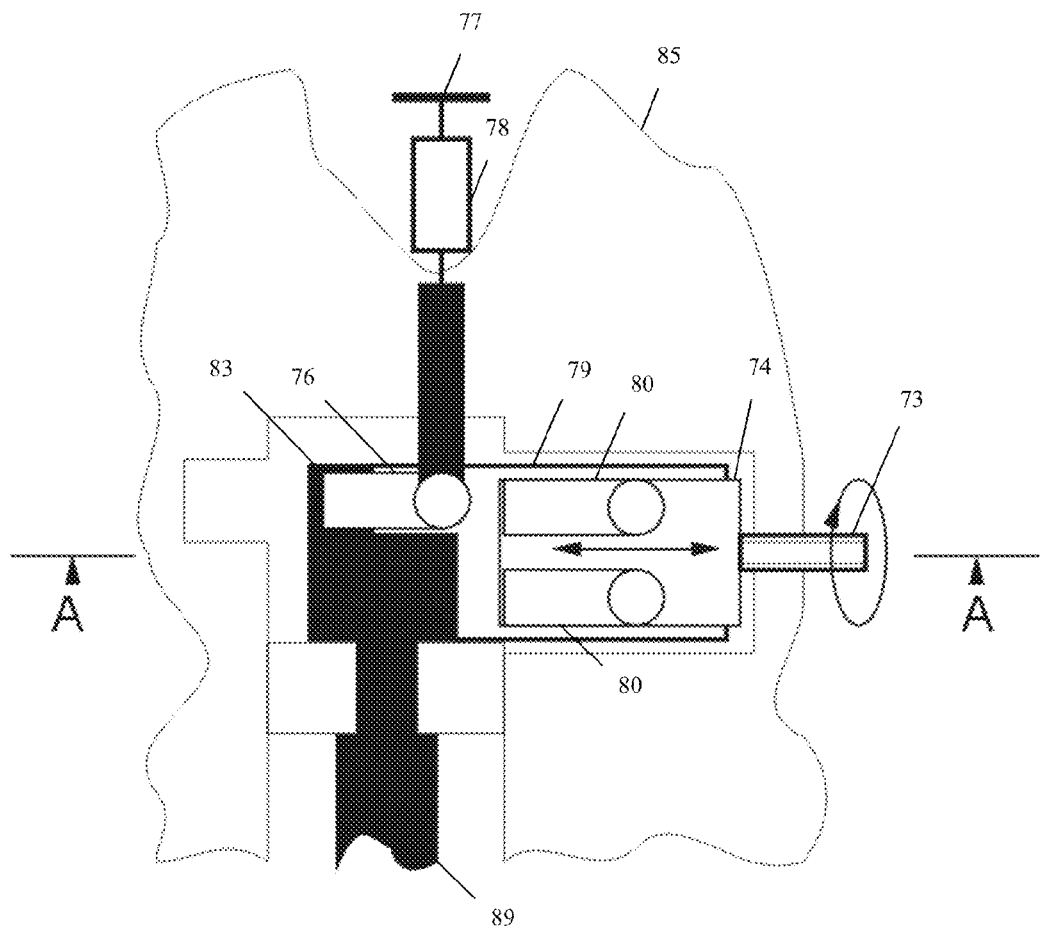
Figure 11:
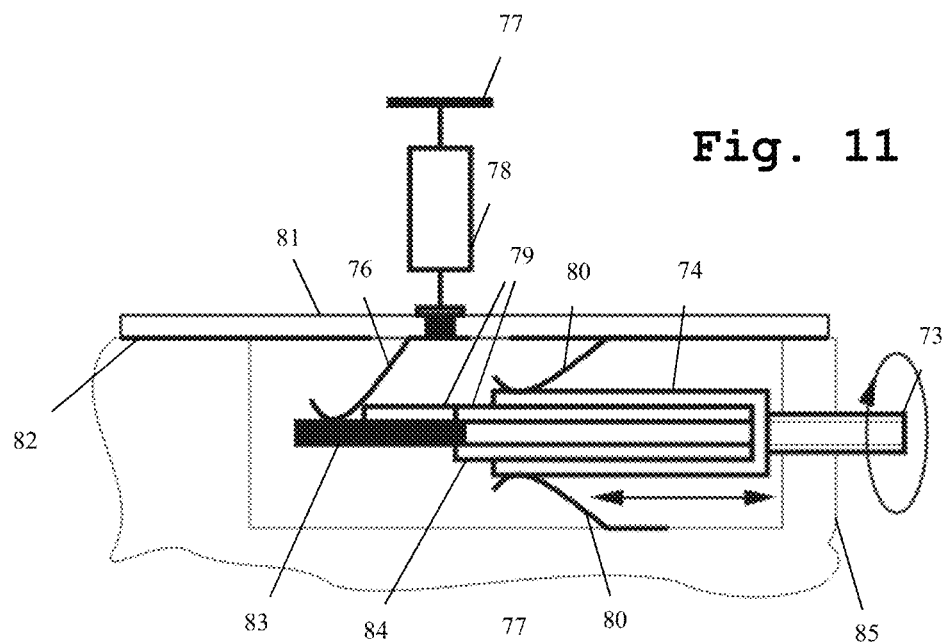
Figure 12:
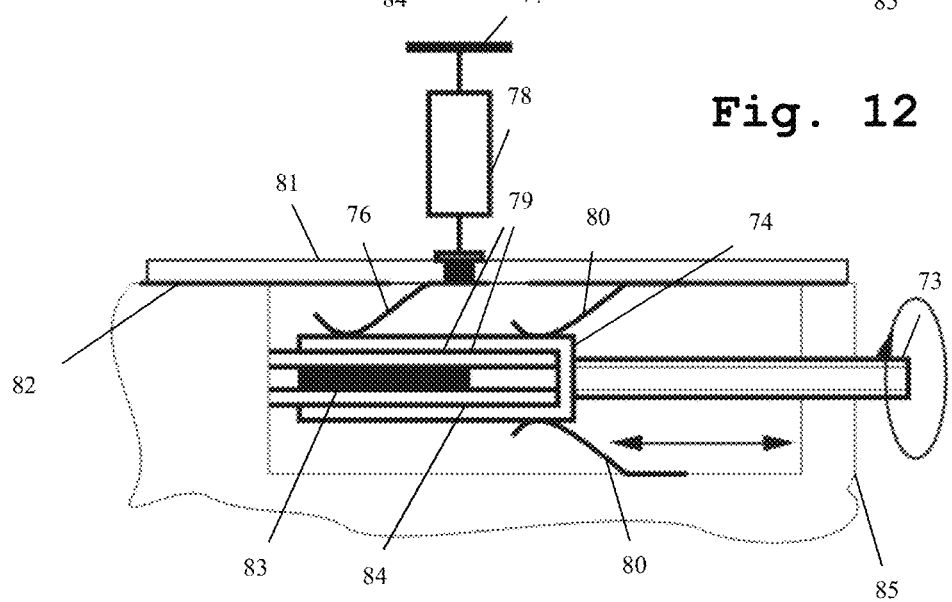
Figure 13:
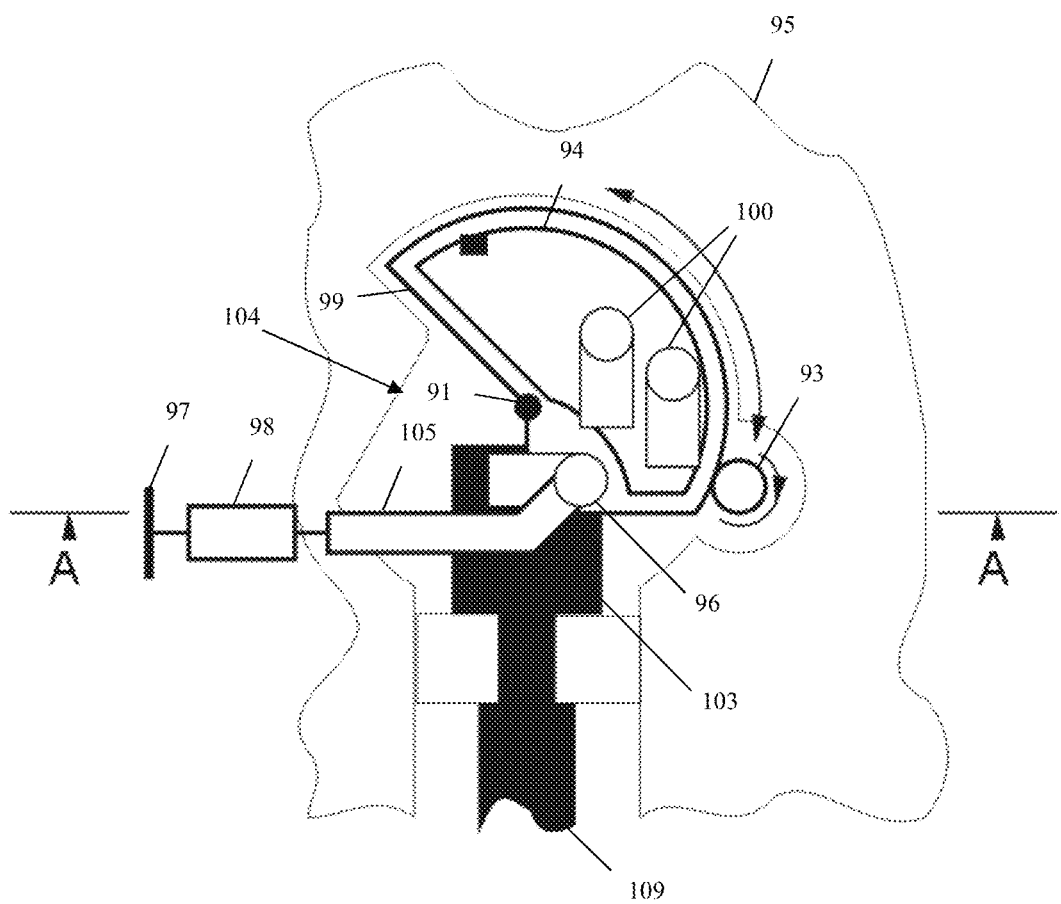
Figure 14:
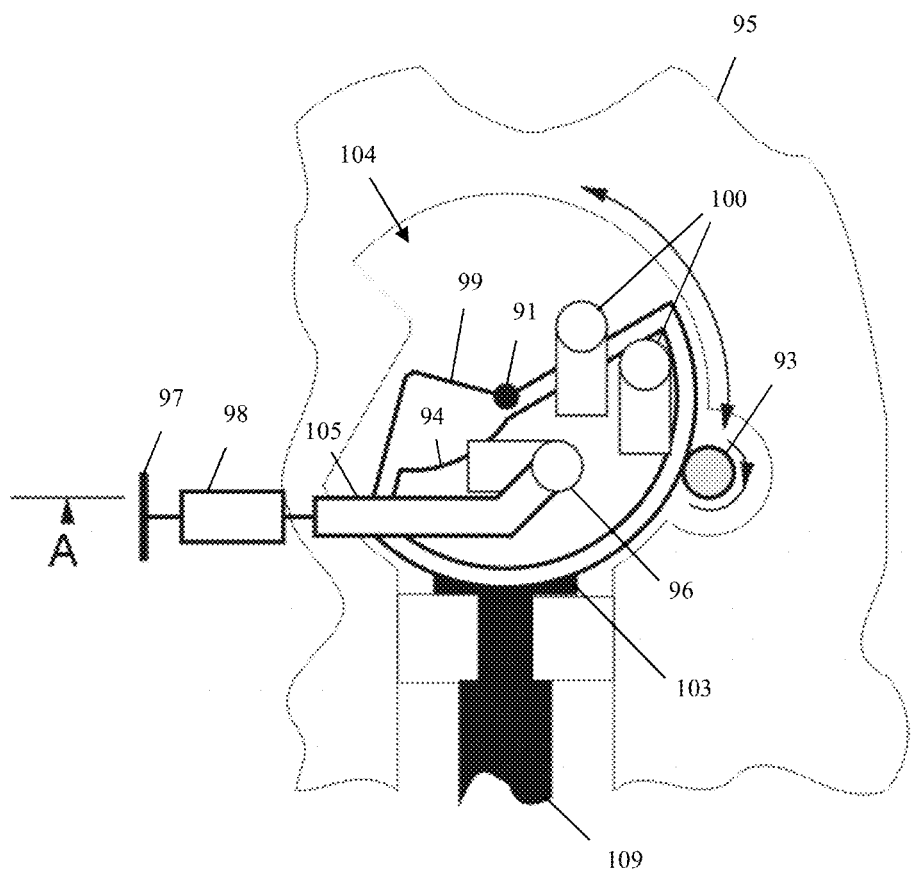
Figure 15:
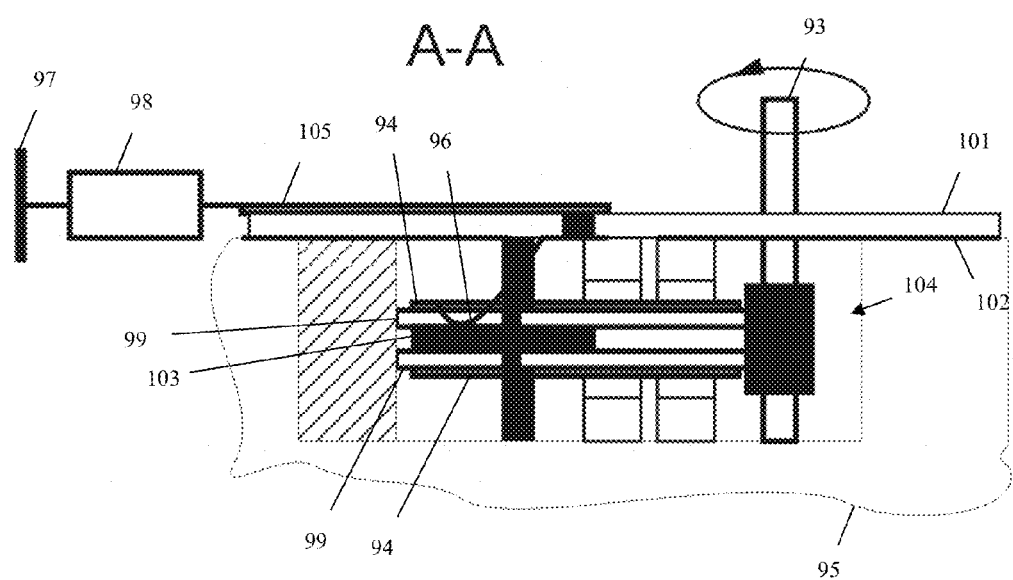

The invention is described by way of example below with reference to the drawings in which advantageous exemplary embodiments of the invention are illustrated. The drawings are as follows:

FIG. 1 a first exemplary embodiment of the amplifier according to the invention;

FIG. 2 a second exemplary embodiment of the amplifier according to the invention;

FIG. 3 a third exemplary embodiment of the amplifier according to the invention;

FIG. 4 a fourth exemplary embodiment of the amplifier according to the invention;

FIG. 5 a fifth exemplary embodiment of the amplifier according to the invention;

FIG. 6a a sixth exemplary embodiment of the amplifier according to the invention in a first switching state;

FIG. 6b the sixth exemplary embodiment of the amplifier according to the invention in a second switching state;

FIG. 7 a detail view of the sixth exemplary embodiment of the amplifier according to the invention;

FIG. 8 a first exemplary embodiment of the capacitor circuit according to the invention in a first state;

FIG. 9 the first exemplary embodiment of the capacitor circuit according to the invention in a second state;

FIG. 10 a first view of a second exemplary embodiment of the capacitor circuit according to the invention in a first state;

FIG. 11 a second view of the second exemplary embodiment of the capacitor circuit according to the invention in the first state;

FIG. 12 the second exemplary embodiment of the capacitor circuit according to the invention in a second state;

FIG. 13 a first view of a third exemplary embodiment of the capacitor circuit according to the invention in a first state;

FIG. 14 the third exemplary embodiment of the capacitor circuit according to the invention in a second state; and FIG. 15 a second view of the third exemplary embodiment of the capacitor circuit according to the invention in the first state.

Initially, the structure and method of functioning of the amplifier according to the invention will be explained with reference to FIGS. 1-7. Following this, the structure and method of functioning of various forms of the capacitor circuit according to the invention will be explained with reference to FIGS. 8-15. The presentation and description of identical elements in similar drawings will not be repeated in some cases.

FIG. 1 shows a first exemplary embodiment of the amplifier according to the invention. A power splitter 15 provides two input terminals 10 and 11. An input signal can be fed in at the first input terminal 10. The second input terminal 11 is connected to a resistor 19 and a ground connection 20. Furthermore, a first amplifier circuit 16 and a second amplifier circuit 17 are connected to the power splitter 15. These form the main amplifier and the auxiliary amplifier according to the Doherty principle. Outputs from these amplifier circuits 16, 17 are connected to a hybrid-coupler circuit 18. An insulation terminal 12 of this hybrid-coupler circuit 18 is terminated with a discrete capacitor 30 and a ground connection 31. The capacitor 30 and the ground connection 31 therefore form a termination 1.

The signal to be amplified is supplied to the input terminal 10 of the power splitter 15. The latter splits the signal between the two amplifier circuits 16, 17, which amplify the signal according to the Doherty principle. The amplified signals are combined by the hybrid-coupler circuit 18 at its output terminal 13. An optimum termination of the hybrid-coupler circuit 18 with a given frequency is achieved by the capacitor 30 and the ground connection 31 at the insulation terminal 12 of the hybrid-coupler circuit 18. At the same time, a very small structural space is required.

A further advantageous embodiment is to exchange the first amplifier circuit 16 and the second amplifier circuit 17 in the circuit. A Doherty amplifier which operates in an inverse manner at a different frequency is obtained in this manner. The useful bandwidth of the system is doubled if the operating-point control can change the configuration. However, a coherent frequency range is not necessarily obtained.

FIG. 2 shows a second exemplary embodiment of the amplifier according to the invention. The circuit corresponds largely to the circuit from FIG. 1. The discrete capacitor 30 with fixed capacitance from FIG. 1 is replaced here with an adjustable capacitor 34. The capacitance of this capacitor 34 can be adjusted by a servo motor 33 which is controlled by the control device 32. The capacitor 34, the ground connection 31, the servo motor 33 and the control device 32 thus form a termination 2.

In this manner, it is possible to adjust the frequency for which the hybrid-coupler circuit 18 is optimally terminated. Since the amplifier operates simultaneously only on one frequency, it is unproblematic that the adjustment of the adjustable capacitor 34 by the servo motor 33 requires a certain time.

FIG. 3 shows a third exemplary embodiment of the amplifier according to the invention. This drawing also corresponds largely to the drawing from FIG. 1. Additionally, in this case, the output terminal 12 of the hybrid-coupler circuit 18 is connected to a switch 36. The switch 36 switches between the adjustable capacitor 34 from FIG. 2 and an ohmic terminating resistor 38 in series with a ground connection 37. The capacitor 34, the ground connection 31, the servo motor 33, the control device 32, the switch 36, the ohmic resistor 38 and the ground connection 37 therefore form a termination 3.

This creates a possibility for switching between an operation as a Doherty amplifier and an operation as a conventional, broadband amplifier. In addition to the switching by means of the switch 36, the operating points of the amplifier circuits 16 and 17 must also be matched. In this context, the switch 36 is additionally controlled by the control device 32 from FIG. 2. Accordingly, a manual intervention is not required.

The combination of the switch 36, the adjustable capacitor 34 and the alternatively connected ohmic resistor 38 thus forms a capacitor circuit 40. The following drawings show a possible embodiment of such a capacitor circuit. As an alternative, the adjustable capacitor 34 can also be replaced by an adjustable inductance 35, as illustrated below.

Alternatively, instead of the motor 33 and the adjustable capacitor 34, a switch 36 with several capacitors of fixed capacitance can also be used. In this case the switching is implemented between the ohmic resistor 38 and several fixed capacitances. It is also conceivable to dispense with the switch 36 and the control device 32. In this case, the terminal 12 is connected to the ohmic resistor 38 or a capacitor via a solder bridge.

FIG. 4 shows a fourth exemplary embodiment of the amplifier according to the invention. This amplifier corresponds largely to the amplifier from FIG. 2. However, in this case, the adjustable capacitor 24 has been replaced with an adjustable inductance 35a.

FIG. 5 shows a fifth exemplary embodiment of the amplifier according to the invention. This amplifier corresponds partly with the amplifier from FIG. 2. In this case, the adjustable capacitor 34 has been replaced with a first adjustable capacitor 34a connected to ground 31, an adjustable inductance 35b and a second adjustable capacitor 34b connected to ground 31. These are each adjusted by a dedicated servo motor 33a, 33b and 33c. The servo motors 33a, 33b and 33c are controlled by the control device 32. With this configuration, an even larger bandwidth of the amplifier can be realised. A simple realisation can be achieved by selecting the interactivity to be non-adjustable. Complexity can be further reduced by adjusting the two adjustable capacitors 34a and 34b in a synchronous manner.

Instead of switching between different structural elements by means of an electrically controlled switch 36, as illustrated in FIG. 3, the use of a manually activated switch is also possible. It is also possible to switch between structural elements which are illustrated in the other drawings. The following section describes an exemplary embodiment in which a switching is implemented between an ohmic resistor as illustrated in FIG. 3 and an n-element as illustrated in FIG. 5.

FIG. 6a and FIG. 6b show a sixth exemplary embodiment of the amplifier according to the invention. This amplifier provides an amplifier housing 124 and a plug-in module 120.

The amplifier housing 124 contains all of the structural elements of the amplifier with the exception of at least some the structural elements connected to the insulation terminal. The plug-in module 120 contains at least one part of the structural elements to be connected to the insulation terminal. The amplifier housing 124 provides a recess 121 for receiving the plug-in module 120.

The plug-in module 120 comprises guide pins 123 which engage in guides 125 when the plug-in module 120 is inserted into the recess 121 of the amplifier housing 124 and accordingly allow the plug-in module 120 to be positioned in the amplifier housing 124 with high precision.

Spring contacts 126 for contacting the plug-in module 120 are additionally arranged in the recess 121 of the amplifier housing 124. The function of the spring contacts 126 will be described in greater detail with reference to FIG. 7. The plug-in module 120 further provides a removable cover 122. When the cover 122 is removed, tunable circuit elements can be tuned through this aperture. These elements will also be described in greater detail with reference to FIG. 7.

The plug-in module 120 is accordingly embodied in such a manner that it can be inserted into the recess 121 in different orientations. FIG. 6a shows a first orientation of the plug-in module 120 relative to the recess 121. FIG. 6b shows a second orientation of the plug-in module 120 relative to the recess 121. Inserting the plug-in module 120 into the recess 121 in different orientations establishes a connection between different structural elements in the plug-in module 120 and the remainder of the amplifier within the amplifier housing 124. That is, insertion with different orientations fulfils the function of switching between different connected structural elements. This will also be described in greater detail with reference to FIG. 7.

FIG. 7 shows a detail view of the sixth exemplary embodiment of the amplifier according to the invention. FIG. 7 shows the side of the plug-in module 120 disposed opposite to the view shown in FIGS. 6a and 6b. Here also, the guide pins 123 are clearly visible. The plug-in module 120 contains an π-element 140, which is formed from two adjustable capacitors 133, 134 and one inductance 130. The capacitors 133, 134 presented here are adjustable cylindrical capacitors. The capacitances of the cylindrical capacitors 133, 134 can be tuned by means of screws through the cover 122 illustrated in FIGS. 6a and 6b, which is arranged on the underside of the plug-in module 120 shown in FIG. 7. The use of other adjustable elements is also conceivable here. Instead of an π-element 140, a single adjustable capacitor or any of the elements shown in FIGS. 1-5 connected to the terminal 12 could be used as alternatives.

A socket contact 131 is additionally connected to a first terminal of the first capacitor 133. The inductance 130 is further connected to this first terminal. In this context, the inductance 130 is formed by a half winding, that is, a 180°-wire-loop. The inductance 130 connects the first terminal of the first capacitor 133 to a first terminal of the second capacitor 134. In each case the second terminals of the capacitors are connected to the housing, that is, to ground.

Beyond this, the plug-in module 120 contains a second socket contact 132, which is connected to a contact bridge 135. The contact bridge 135 is embodied in such a manner that it establishes a connection with a 50-ohm load arranged in the amplifier housing 124 when the plug-in module 120 is inserted into the recess 121 of the amplifier housing 124 in a first orientation. In this orientation, the port socket 132 establishes direct contact with the output 12 of the amplifier. That is, in this orientation, the contact bridge 135 connects the terminal 12 of the amplifier to a 50-ohm load. With regard to FIG. 3, this corresponds to the lower switch setting of the switch 36. This first orientation of the plug-in module 120 therefore corresponds with the conventional AB operating mode of the amplifier.

However, if the plug-in module 120 is inserted into the recess 121 of the amplifier housing 124 in the second orientation, the contact socket 131 makes contact with the terminal 12. In this manner, the terminal 12 is connected to the π-element 140. This second orientation of the plug-in module 120 therefore corresponds to a connection of an π-element to the terminal 12 of the amplifier, as illustrated in FIG. 5. A connection of this kind corresponds to the Doherty operating mode of the amplifier.

The plug-in module 120 additionally provides several coding screws 136. These are arranged on the plug-in module 120 in such a manner that, when the plug-in module 120 is inserted into the recess 121, they make contact with the spring contacts 126. These spring contacts 126 are arranged only on one of the two opposite sides of the recess 121 so that they can make contact with the coding screws only in the second orientation of the plug-in module 120, that is, when operating the amplifier as a Doherty amplifier.

As a result of the presence of the coding screws, the respective spring contact 126 disposed under them is closed. Accordingly, the spring contacts 126 are connected to a control device in such a manner that the latter recognises the switching state of every individual spring contact 126. The coding screws 136 can be tightened or loosened individually. They can also be removed individually. Accordingly, the bit pattern, which is formed as a result of the presence or absence of the individual screws or the depth of screwing of the individual screws, codes the tuning frequency of the π-element 140 currently adjusted. That is to say, when setting a frequency range for the Doherty operating mode of the amplifier according to the invention, the adjusted frequency is additionally manually modelled as a bit pattern in the coding screws 136. The amplifier therefore recognises, via the spring contacts 126, the frequency to which the π-element 140 is adjusted.

Via the 5 illustrated coding screws 136, 32 adjustable channels, that is, 32 channels are conceivable in principle. In practice, for example, 12 channels are operated in this context in the UHF range. With each individual setting, the system operates optimally on 3-4 channels and in an acceptable manner in the respectively adjacent channels. With corresponding tuning, the amplifier can be used in the Doherty mode over the entire frequency range between 470 and 862 MHz. Accordingly, there are 7 standard tunings which cover the entire frequency range. The standard tunings can also be optimised beyond this on given channels within their tuning range.

FIGS. 8 and 9 show a first exemplary embodiment of the capacitor circuit according to the invention. A first capacitor plate 61 is connected to a terminal 52, which corresponds to the output terminal 12 from FIGS. 1-5. Together with a second capacitor plate 64, this forms a capacitor 54. The second capacitor plate 64 is connected in this context to a motorised spindle 53. The spacing distance between the second capacitor plate 64 and the first capacitor plate 61 is adjusted by means of the motorised spindle 53. The motorised spindle 53 is accordingly driven by a servo motor. As an alternative, the use of a manually driven spindle is also possible.

An insulator plate 62, which provides a carrier 65, is connected to the second capacitor plate 64. In turn, the carrier 65 is connected to a conductor portion 63, which is connected to a switch terminal 56. By means of the switch terminal 56, the first capacitor plate 61 can be connected to a conductor portion 60. The conductor portion 60 is connected, in turn, to a terminating resistor 58 and the ground connection 57. The capacitor 54 here corresponds to the adjustable capacitor 34 from FIGS. 2-3. The switch terminal 56 here corresponds to the switch 36 from FIGS. 2-3. The terminating resistor 58 and the ground connection 57 correspond to the terminating resistor 38 and the ground connection 37 from FIG. 3.

FIG. 8 shows a first state of the capacitor circuit. The motorised spindle 53 has moved the second capacitor plate 64 to a maximum distance from the first capacitor plate 61. The insulator plate 62 and the carrier 65 pull the conductor portion 63, and with it also the switch termination 56, which is realised here as a contact spring, towards the first capacitor plate 61 and the conductor portion 60. The first capacitor plate 61, the switch connection 56, the conductor portion 63 and the conductor portion 60 are therefore electrically connected to one another. The terminal 52 is accordingly electrically connected to the terminating resistor 58 and through this to the ground connection 57. This corresponds to the lower switch position of the switch 36 from FIG. 3.

FIG. 9 shows a second state of the capacitor circuit. The motorised spindle 53 has moved the second capacitor plate 54, and with it also the insulator plate 62, the carrier 65, the conductor portion 63 and the switch terminal 56, downwards. The switch terminal 56 has lost contact with the first capacitor plate 61 and the conductor portion 60. This corresponds to the upper switch position of the switch 36 from FIG. 3. As a result of the distance between the first capacitor plate 61 and the second capacitor plate 64, the capacitance of the capacitor 54 is adjusted. That is to say, it is matched in this manner to the operating frequency of the amplifier within which this capacitor circuit can be used.

Since the insulator plate 62 and the carrier 65 are made from a non-conducting material, they only influence the field characteristic of the capacitor 54 to an insubstantial extent. By manufacturing the insulator plate 62 and the carrier 65 from a material which provides a similar dielectric constant to the surrounding medium, for example, air, the influence can be further reduced.

In the switch position illustrated in FIG. 8, the first capacitor plate 61 acts only as a conductor which connects the terminal 52 to the terminating resistor 58. In this context, the distance from the second capacitor plate 64 is so large that no significant effect occurs. Accordingly, the second capacitor plate 54 is disposed at ground potential via the motorised spindle and the housing 51.

FIGS. 10-12 show a second exemplary embodiment of the capacitor circuit according to the invention. The view in FIGS. 11 and 12 corresponds to the section along the sectional line A from FIG. 10. A housing 85 is disposed at ground potential. The housing 85 is covered on one side by a conductor plate 81, which is provided with a metallised ground layer 82 on its underside. A conductor 89 is disposed in the recess of the housing 85. This is realised here as a flat strip conductor. The upper end of the conductor 89 in this context is embodied to form a first capacitor plate 83.

In a first state which is illustrated in FIG. 10 and FIG. 11, the first capacitor plate 83 is connected, via a switch terminal 76, which is realised here as a contact spring, to a terminating resistor 78 and a ground connection 77. This corresponds to the lower switch position from FIG. 3. The conductor 89 is thus connected at its lower end to the insulation terminal of the amplifier, in which the capacitor circuit shown here is inserted.

A motorised spindle 73 which can be driven, for example, by the servo motor 33 from FIG. 3, is connected to a second capacitor plate 74. The second capacitor plate 74 is connected to an insulator plate 79. The insulator plate 79 provides a projection in the region of the switch terminal 76. In this context, the second capacitor plate 74 is embodied in such a manner that it can surround the first capacitor plate. Accordingly, on its upper side, it is separated by the first insulator plate 69 from the first capacitor plate 83. On its underside, it is held at a distance from the first capacitor plate 83 by a second insulator plate 84, which is also connected to the second capacitor plate 74.

In a first state, which is shown in FIG. 10 and FIG. 11, the switch terminal 76 is disposed in contact with the first capacitor plate 83. Accordingly, a conducting connection to the terminal 82 and the terminating resistor 78 is provided. In a second state, which is shown in FIG. 12, the motorised spindle 73 has moved the second capacitor plate 74 and the first and second insulator plate 79, 84 in the direction towards the first capacitor plate 83. The projection of the first insulator plate 79 has lifted the switch terminal 76 from the first capacitor plate 83 and therefore interrupted the electrical connection of the line 89 to the terminating resistor 78. At the same time, the second capacitor plate 74 has been fitted around the first capacitor plate 83. As a result, the capacitance between the first capacitor plate 83 and the second capacitor plate 74 has risen significantly. Accordingly, the second capacitor plate 74 is disposed in electrical contact with contact springs 80, which establish a contact with the housing 85 disposed at ground potential. The required capacitance can be adjusted by means of the motorised spindle 73, via the precise positioning of the second capacitor plate 74. This allows an adjustment of the operating frequency of the amplifier into which the capacitor circuit shown here is to be inserted.

FIGS. 13-15 show a further exemplary embodiment of the capacitor circuit according to the invention. In this context, a rotary capacitor is used to adjust the capacitance. A recess 104 is arranged in a housing 95 disposed at ground potential. The end of a line 109, which is widened to form a first capacitor plate 103, projects into the recess 104. Furthermore, a second capacitor plate 94 which can be rotated about a rotary axle 91 is arranged in the recess 104. Accordingly, the second capacitor plate 94 is embodied in such a manner that it can surround the first capacitor plate 103. The second capacitor plate 94 is therefore connected to an insulator plate 99, which is also designed in such a manner that it can surround the first capacitor plate 103. In this case, the insulator plate 99 is disposed in contact with a motorised spindle 93. By means of a friction wheel or a cogwheel, the motorised spindle 93 engages tangentially on the periphery of the plate and rotates the insulator plate 99 and the second capacitor plate 94 around the rotary axle 91. As an alternative, a direct drive by the rotary axle 91 is possible. In this case, the motorised spindle 93 can be omitted.

A switch terminal 96, which is embodied here as a contact spring, is connected by means of a conductor portion 105 to a terminating resistor 98 and via the latter to a ground connection 97.

In a first state, which is illustrated in FIG. 13 and FIG. 15, the switch terminal 96 establishes a contact between the first capacitor plate and the conductor portion 105. The line 109 is accordingly electrically connected to the terminating resistor 98 and via the latter to the ground connection 97. This corresponds to the lower switch position from FIG. 3.

In a second state, which is shown in FIG. 14, the second capacitor plate 94 and the insulator plate 99 are rotated around the rotary axle 91 in such a manner that the insulator plate 99 and the second capacitor plate 94 interrupt the contact between the switch terminal 96 and the first capacitor plate. The second capacitor plate 94 and the insulator plate 99 now surround the first capacitor plate 103. The second capacitor plate 94 is disposed in electrical contact via contact springs 100 with the housing 95 disposed at ground potential. The state illustrated here corresponds to the upper switch position from FIG. 3. The overlapping of the first capacitor plate 103 and the second capacitor plate 94 can be adjusted via the angle of rotation of the second capacitor plate 94 about the rotary axle 91. In this case, the degree of overlap adjusts the capacitance of the resulting capacitor. The insulator plate 99 thus ensures a constant spacing distance between the first capacitor plate 103 and the second capacitor plate 94. Accordingly, the operating frequency of an amplifier, in which the capacitor circuit shown here is used, is adjusted via the rotary angle.

As already illustrated with reference to FIGS. 11-12, the housing 95 here also provides a cover by means of a conductor plate 101. Here also, the underside of the conductor plate 101 is provided with a metallisation 102.

The invention is not restricted to the exemplary embodiment shown. In particular, the capacitor circuit illustrated can also be used in other circuits. A switching or respectively a re-plugging of different structural elements than those illustrated here is also conceivable. All of the features described above or illustrated in the drawings can be advantageously combined with one another within the scope of the invention.

The invention claimed is:
1. An amplifier, comprising:
a first amplifier circuit;
a second amplifier circuit;
a first hybrid-coupler circuit including an output terminal and an insulation terminal; and
a termination connected to the insulation terminal of the first hybrid-coupler circuit,
wherein the termination comprises a first capacitor and/or an inductance, which is arranged directly at the insulation terminal of the first hybrid-coupler circuit,
wherein the termination further includes a switch and a terminating resistor, and
wherein the switch is connected at its input terminal to the insulation terminal and is connected at its first output terminal to the terminating resistor, and if the termination provides a first capacitor, the switch is connected at its second output terminal to the first capacitor, and if the termination provides an inductance and not a first capacitor, the switch is connected at the second output terminal to the inductance.

2. The amplifier according to claim 1, wherein the first capacitor and/or the inductance is connected directly, without intermediate connection of a line element or only with a line element of which the length is shorter than 1/10 of the shortest wavelength used, to the insulation terminal of the first hybrid-coupler circuit.

3. The amplifier according to claim 1, wherein if the termination provides a first capacitor, the first capacitor is configured in such a manner that its capacitance is adjustable with reference to the operating frequency of the amplifier.

4. The amplifier according to claim 1, wherein if the termination comprises an inductance, the inductance is configured in such a manner that its inductance value is adjustable with reference to the operating frequency of the amplifier.

5. The amplifier according to claim 1, wherein if the termination provides a first capacitor, the first capacitor is a rotary capacitor or a slide capacitor.

6. The amplifier according to claim 1, wherein:
the termination comprises the first capacitor, a second capacitor and the inductance;
the first capacitor is connected to the insulation terminal and the inductance; and
the second capacitor is connected to the inductance.

7. The amplifier according to claim 6, wherein the second capacitor is a rotary capacitor or a slide capacitor.

8. The amplifier according to claim 1, wherein the amplifier further provides a control device, which, if the termination provides a first capacitor, adjusts the first capacitor, and/or, if the termination provides a second capacitor, adjusts the second capacitor, and/or, if the termination provides an inductance, adjusts the inductance, and/or, if the termination provides a switch, activates the latter.

9. The amplifier according to claim 1, wherein if the termination provides a switch and a first capacitor, these are formed by a capacitor circuit, and/or if the termination provides a switch and a second capacitor, these are formed by a capacitor circuit, wherein each capacitor circuit comprises:
a first capacitor plate;
a second capacitor plate;
an insulator plate, the second capacitor plate being rigidly connected to the insulator plate, whereas the second capacitor plate and the insulator plate are displaceable relative to the first capacitor plate; and
a terminal, connected in a detachable manner to the first capacitor plate.

10. An amplifier, comprising:
a first amplifier circuit;
a second amplifier circuit;
a first hybrid-coupler circuit including an output terminal and an insulation terminal; and
a termination connected to the insulation terminal of the first hybrid-coupler circuit, wherein the termination comprises a first capacitor and/or an inductance, which is arranged directly at the insulation terminal of the first hybrid-coupler circuit, and
wherein:
the amplifier provides an amplifier housing and a plug-in module,
the amplifier housing provides a recess for receiving the plug-in module,
the plug-in module contains the first capacitor and/or the first inductance, and
the plug-in module is embodied in such a manner that, when the plug-in module is inserted into the recess in a first orientation, it connects the first capacitor and/or the first inductance to the insulation terminal.

11. The amplifier according to claim 10, wherein the plug-in module is embodied in such a manner that, when the plug-in module is inserted into the recess in a second orientation, it connects an ohmic resistor connected to ground to the insulation terminal.

12. The amplifier according to claim 10, wherein:
the plug-in module comprises coding screws,
the recess comprises spring contacts,
the plug-in module is embodied in such a manner that the coding screws establish contact with the spring contacts when the plug-in module is inserted into the recess, and
the coding screws encode a present tuning frequency.

* * * * *